(12) United States Patent
Tsai et al.

(10) Patent No.: US 8,736,059 B2
(45) Date of Patent: May 27, 2014

(54) INTERCONNECTING MECHANISM FOR 3D INTEGRATED CIRCUIT

(75) Inventors: Ming-Fan Tsai, Taichung (TW); Hsin-Hung Lee, Taichung (TW); Bo-Shiang Fang, Taichung (TW); Li-Fang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 233 days.

(21) Appl. No.: 13/306,051

(22) Filed: Nov. 29, 2011

(65) Prior Publication Data
US 2013/0034971 A1 Feb. 7, 2013

(30) Foreign Application Priority Data
Aug. 3, 2011 (TW) .............................. 100127519 A

(51) Int. Cl.
*H01L 23/52* (2006.01)
(52) U.S. Cl.
USPC ................... 257/773; 257/774; 257/E23.011; 257/E23.174

(58) Field of Classification Search
USPC .......... 257/621, 773, 774, E23.011, E23.174, 257/758
See application file for complete search history.

(56) References Cited

U.S. PATENT DOCUMENTS 8,105,875 B1 * 1/2012 Hu et al. ........................ 438/107
2012/0267776 A1 * 10/2012 Nin ............................... 257/737

* cited by examiner

*Primary Examiner* — Matthew W Such
*Assistant Examiner* — Ali Naraghi
(74) *Attorney, Agent, or Firm* — Edwards Wildman Palmer LLP; Peter F. Corless; Steven M. Jensen

(57) ABSTRACT

An interconnecting mechanism is provide, which includes paired first sub-interconnecting mechanisms and paired second sub-interconnecting mechanisms. The first pair of sub-interconnecting mechanisms includes first and second axially symmetrical spiral conductive elements. The second pair of sub-interconnecting mechanisms includes third and fourth axially symmetrical spiral conductive elements. Configuring the pairs of sub-interconnecting mechanisms in a differential transmission structure having a spiral shape is used to avert sounds and noise signals between different chips or substrates caused by a miniaturizing fabrication process or an increased wiring density.

16 Claims, 6 Drawing Sheets

INTERCONNECTING MECHANISM FOR 3D INTEGRATED CIRCUIT

CROSS-REFERENCES TO RELATED APPLICATIONS

This application claims under 35 U.S.C. §119(a) the benefit of Taiwanese Application No. 100127519, filed Aug. 3, 2011, the entire contents of which is incorporated herein by reference.

BACKGROUND OF THE INVENTION

1. Field of the Invention

The invention is related to an interconnecting mechanism for a three-dimensional integrated circuit, and, more particularly, to an interconnecting mechanism that reduces the crosstalk effect for a three-dimensional integrated circuit.

2. Description of Related Art

Due to the increasing importance of thinness and compactness of portable electronic device for communications, computing and so on, and due to the fact that such electronic products are increasingly multi-function and high performance, semiconductor process technology is moving toward higher integration, such that package structures with ever greater density are being pursued by manufacturers. Thus, manufacturers of both semiconductors and semiconductor packages have started utilizing three-dimensional package techniques to realize a compact packaging system with higher density.

Three-dimensional package techniques result in so-called 3D IC's, integrating a plural layers of chips or circuit substrates by various means into a single integrated circuit. In particular, 3D IC techniques commonly interconnect a plurality of chips using a three-dimensional packaging method on a single integrated circuit. Thus, an interconnecting technique with high density is required to install electrical junctions on the active surface and/or reverse surface of chips for providing a three-dimensional stack and/or package with high density.

Through-silicon via (TSV) technology is currently one of the crucial ways to realize 3D IC's, wherein through-silicon vias are utilized for vertical electrical connections in chips or substrates, allowing the stacking of more chips on a given area to increase the overall package density. Moreover, good use of through-silicon vias can effectively integrate different processes or reduce transmission delays, while reducing power consumption, raising efficiency, and increasing transmission bandwidth due to shorter interconnection pathways. Thus, TSV technology enables stacking of chips to achieve low power consumption, high density packaging and miniaturization.

However, currently, traditional TSV may generate far-end crosstalk and near-end crosstalk between a plurality of through-silicon vias, causing adverse effects on overall chip functionality. As shown in FIG. 1, which depicts the level of near-end crosstalk generated by traditional TSV using current technology, traditional TSV exhibits a near-end crosstalk of −55.077 dB under a signal frequency of 1 GHz (curve S41), while exhibiting a near-end crosstalk of −35.478 dB under a signal frequency of 10 GHz (curve S41). Moreover, FIG. 2 depicts far-end crosstalk generated by traditional TSV technology, showing that traditional TSV exhibits a far-end crosstalk of −57.242 dB under a signal frequency of 1 GHz (curve S31), while exhibiting far-end crosstalk of −37.622 dB under a signal frequency of 10 GHz (curve S31).

Thus, developing an applicable interconnection mechanism that reduces or prevents near-end and far-end crosstalk in a plurality of through-silicon vias in a 3D IC is a highly desirable in the industry.

SUMMARY OF THE INVENTION

In view of the disadvantages of the prior art, the invention provides an interconnecting mechanism formed in a dielectric layer of a three-dimensional integrated circuit, comprising: a pair of first sub-interconnecting mechanisms including a first spiral conductive element formed in the dielectric layer with a first axis perpendicular to the planar direction of the dielectric layer, and a second spiral conductive element formed in the dielectric layer with a second axis perpendicular to the planar direction of the dielectric layer, wherein the first spiral conductive element is axially symmetrical to the second spiral conductive element; and a pair of second sub-interconnecting mechanisms including a third spiral conductive element formed in the dielectric layer with a third axis perpendicular to the planar direction of dielectric layer, and a fourth spiral conductive element formed in the dielectric layer with a fourth axis perpendicular to the planar direction of dielectric layer, wherein the third spiral conductive element is axially symmetrical to the fourth spiral conductive element, and the third spiral conductive element and the fourth spiral conductive element are located beside the first spiral conductive element and the second spiral conductive element.

Compared to the prior art, the present invention can not only effectively reduce the crosstalk effect in the signal paths of a 3D IC, reducing possible far-end crosstalk and near-end crosstalk generated between each input port and output port, but also can avoid reduction of the signal integrity with an increase of system complexity, integrate differing semiconductor processes, lower both transmission delays and power consumption through the shortening of interconnection paths, and raise the signal transmission bandwidth, thus further accommodating the next generation of electronic devices.

DETAILED DESCRIPTION OF PREFERRED EMBODIMENTS

The following is explanation of the disclosed embodiments by examples, such that those familiar with this technical field can easily understand the advantages and efficacy by the explanation.

Note that the illustrated structures, ratios and sizes of elements of the disclosed embodiments in the appended figures and in the explanation are only provided for general understanding, particularly by those who are familiar with this technical field. Such details are not intended to limit the implementing conditions of the disclosed embodiments, and such details and illustrations are not directly applicable to realizing the invention. Various modifications of structure, ratio and size will fall within the scope of the disclosed embodiments when the efficacy and purpose of the disclosed embodiments are not affected. Meanwhile, terms in the explanation like "first," "second," "third," "fourth," "upper," "lower," "top," "bottom," "a," and so on are only intended for convenience of description rather than for limiting the feasible scope of the disclosed embodiments. Adjustments of the relative relationships without actual alteration of the essence of the structures and techniques should be seen as within the feasible scope of the disclosed embodiments.

Figure 3:
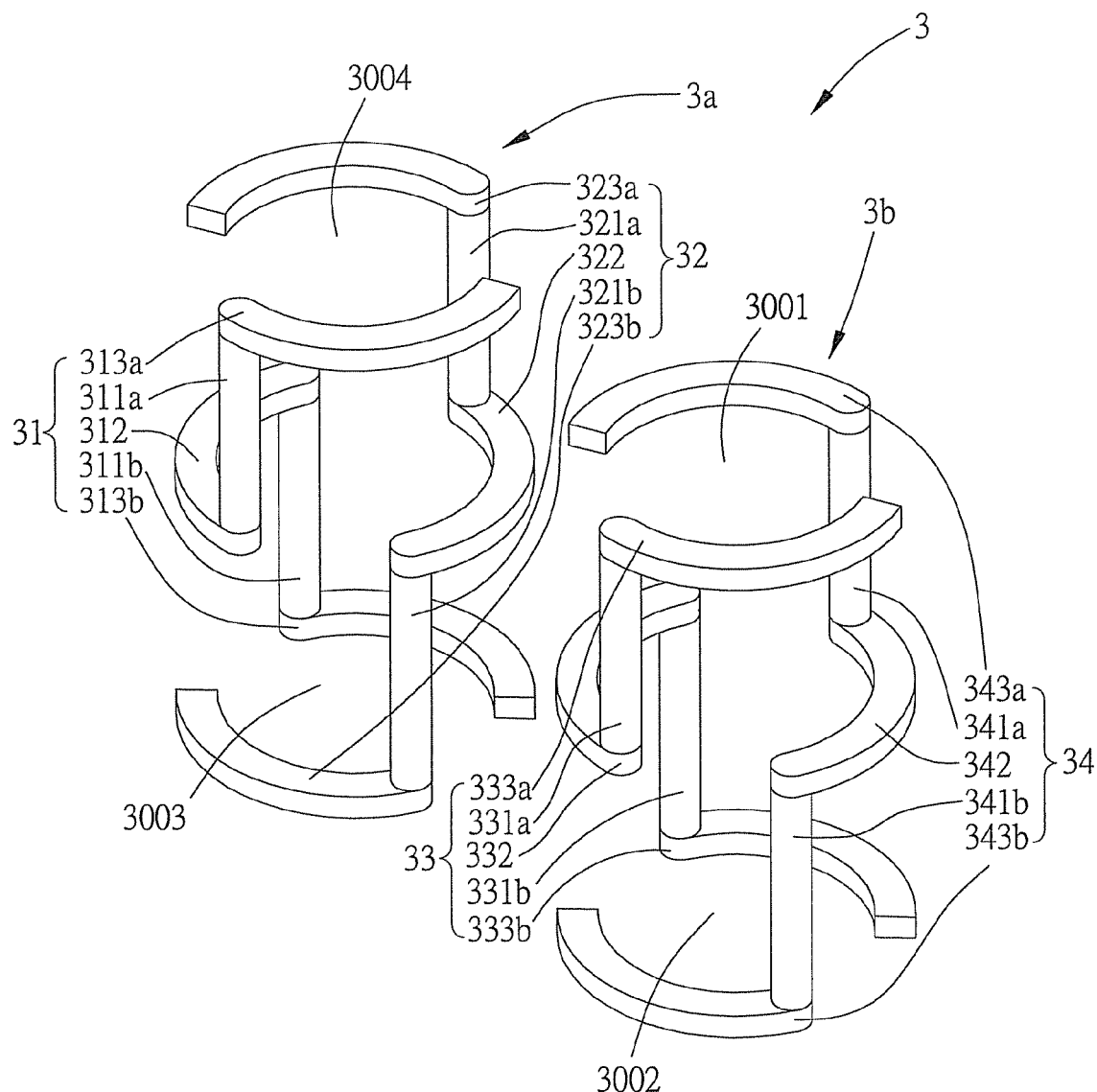
FIG. 3 provides a perspective view of an interconnecting mechanism according to an embodiment of the present invention.

FIG. 3 provides a perspective view of an interconnecting mechanism 3 according to the present invention. The interconnecting mechanism 3 is formed in a dielectric layer (not shown) and includes a paired first sub-interconnecting mechanism 3a having a first spiral conductive element 31 and a second spiral conductive element 32, and a paired second sub-interconnecting mechanism 3b having a third spiral conductive element 33 and a fourth spiral conductive element 34. The first, second, third and fourth spiral conductive elements 31, 32, 33 and 34 have their axes perpendicular to the planar direction of the dielectric layer.

The first spiral conductive element 31 is axially symmetrical to the second spiral conductive element 32. The third spiral conductive element 33 is axially symmetrical to the fourth spiral conductive element 34. The third spiral conductive element 33 and the fourth spiral conductive element 34 are located beside the first spiral conductive element 31 and the second spiral conductive element 32.

The first spiral conductive element 31 has a first upper through-silicon via 311a, a first lower through-silicon via 311b, a first connection section 312, a first upper section 313a and a first lower section 313b. The first connection section 312, the first upper section 313a and the first lower section 313b are arc-shaped. The first upper through-silicon via 311a and the first lower through-silicon via 311b are perpendicular to the planar direction of the dielectric layer. The first upper section 313a and the first lower section 313b are parallel to the planar direction of the dielectric layer.

The first connection section 312 is connected to the bottom of the first upper through-silicon via 311a and connected to the top of the first lower through-silicon via 311b, wherein the first connection section 312 is dislocated with the first upper section 313a and the first lower section 313b, such that the first upper section 313a and the first lower section 313b form the first spiral conductive element 31. Likewise, the second, third and fourth spiral conductive elements 32, 33 and 34 have a similar structure to that of the first spiral conductive element 31. Therefore, two sets of differential transmission paths are formed, which commonly form two sets of spiral interconnecting mechanisms.

The second spiral conductive element 32 has a second upper through-silicon via 321a, a second upper through-silicon via 321b, a second connection section 322, a second upper section 323a and a second lower section 323b. The second connection section 322, the second upper section 323a and the second lower section 323b are arc-shaped. The second upper through-silicon via 321a and the second lower through-silicon via 321b are perpendicular to the planar direction of the dielectric layer. The second connection section 322, the second upper section 323a and the second lower section 323b are parallel to the planar direction of the dielectric layer.

The second connection section 322 is connected to the bottom of the second upper through-silicon via 321a and connected to the top of the second lower through-silicon via 321b. The second connection section 322 is dislocated with the second upper section 323a and the second lower second 323b.

The third spiral conductive element 33 has a third upper through-silicon via 331a, a third lower through-silicon via 331b, a third connection section 332, a third upper section 333a and a third lower section 333b. The third connection section 332, the third upper section 333a and the third lower section 333b are arc-shaped. The third upper through-silicon via 331a and the third lower through-silicon via 331b are perpendicular to the planar direction of the dielectric layer. The third connection section 332, the third upper section 333a and the third lower section 333b are parallel to the planar direction of the dielectric layer.

The third connection section 332 is connected to the bottom of the third through-silicon via 331a and connected to the top of the third lower through-silicon via 331b. The third connection section 332 is dislocated with the third upper section 333a and the third lower section 333b.

The fourth spiral conductive element 34 has a fourth upper through-silicon via 341a, a fourth lower through-silicon via 341b, a fourth connection section 342, a fourth upper section 343a and a fourth lower section 343b. The fourth connection section 342, the fourth upper section 343a and the fourth lower section 343b are arc-shaped. The fourth upper through-silicon via 341a and the fourth lower through-silicon via 341b are perpendicular to the planar direction of the dielectric layer. The fourth connection section 342, the fourth upper section 343a and the fourth lower section 343b are parallel to the planar direction of the dielectric layer.

The fourth connection section 342 is connected to the bottom of the fourth through-silicon via 341a and connected to the top of the fourth lower through-silicon via 341b. The fourth connection section 342 is dislocated with the fourth upper section 343a and the fourth lower section 343b.

Figure 4:
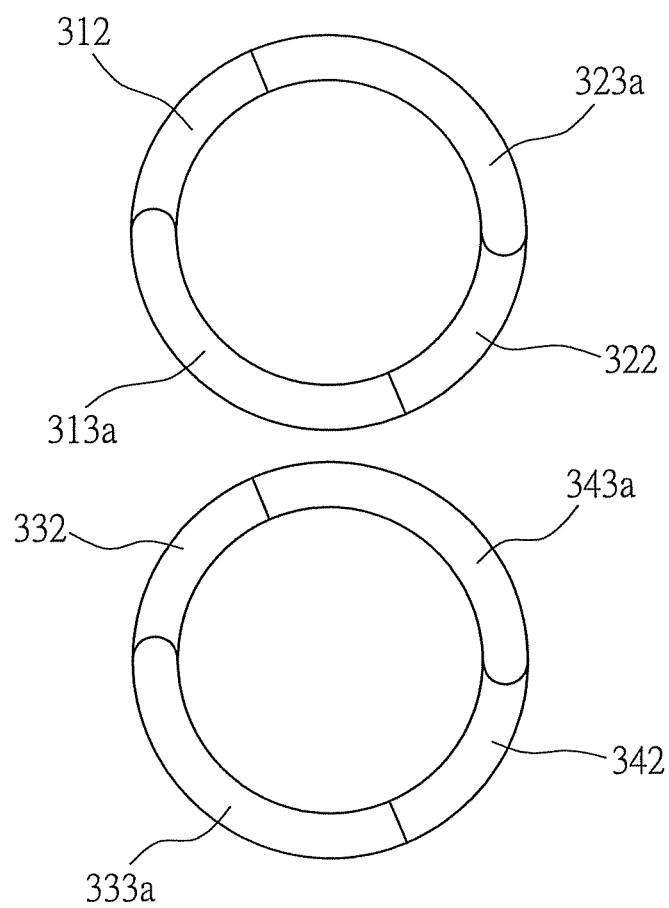
FIG. 4 provides a top view of an interconnecting mechanism according to an embodiments of the present invention.

FIG. 4 provides a top view of the interconnecting mechanism 3 of an embodiment according to the present invention. The first connection section 312 is axially symmetric to the second connection section 322, and the first upper section 313a is axially symmetric to the second upper section 323a, the first connection section 312, the second connection section 322, the first upper section 313a and the second upper section 323a commonly forming a spiral structure in the planar direction of the dielectric surface Likewise, the third connection section 332 is axially symmetric to the fourth connection section 342, and the third upper section 333a is axially symmetric to the fourth upper section 343a, the third connection section 332, the fourth connection section 342, the third upper section 333a and the fourth upper section 343a commonly forming another spiral structure in the planar direction of the dielectric surface.

Figure 5A:
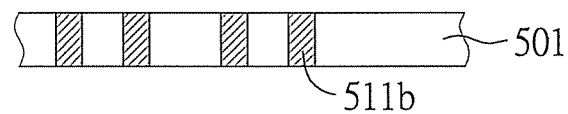
FIGS. 5A to 5G provide profile views of steps for manufacturing an interconnecting mechanism according to an embodiment of the present invention.

FIGS. 5A to 5G provide profile views of steps of manufacturing an interconnecting mechanism of an embodiment according to the present invention. As shown in FIG. 5A, four lower through-silicon vias 511b are formed in a substrate 501 using etching and deposition processes (the substrate or dielectric layer referenced herein referring to objects composed of silicon, silicon nitride, and other organic or non-organic material).

Figure 5B:
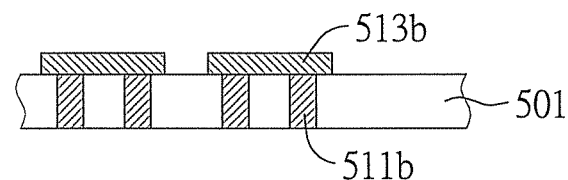

As shown in FIG. 5B, a lower section 513b is formed on the top of the lower through-silicon via 511b by a deposition technique, for example, wherein the lower section 513b has four arc-shaped conductive traces (313b, 323b, 333b and 343b, as shown in FIG. 3), each of which has one end electrically connected to the lower through-silicon via 511b.

Figure 5C:
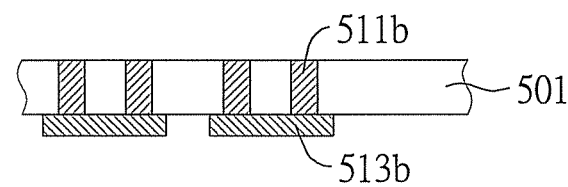

As shown in FIG. 5C, the substrate 501 is turned over, such that the lower section 513b is located beneath the lower through-silicon via 511b.

Figure 5D:
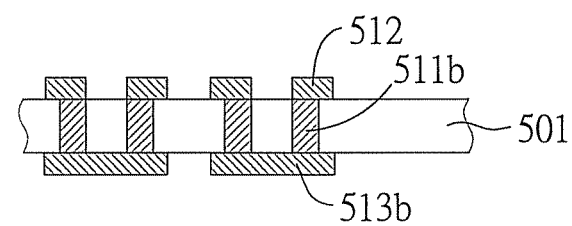

As shown in FIG. 5D, a connection section 512 composed of a conductive material is installed on the lower through-silicon via 511b by a deposition technique, for example, wherein the connection section 512 has four conductive traces (312, 322, 332 and 342, as shown in FIG. 3), each of which has one end electrically connected to the lower through-silicon via 511b.

Figure 5E:
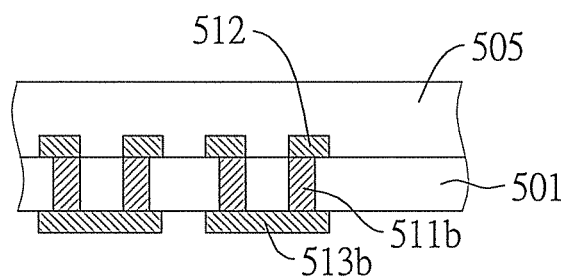

As shown in FIG. 5E, a passivation layer 505 or another dielectric layer is formed on the substrate 501 by, for example, a deposition technique.

Figure 5F:
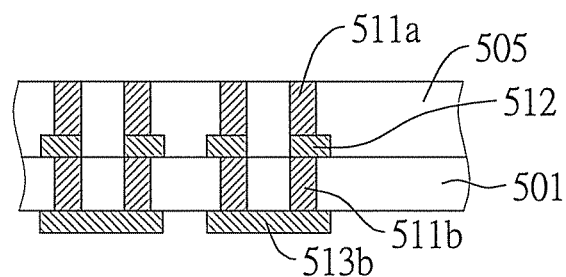

As shown in FIG. 5F, four upper through-silicon vias 511a are formed on the passivation layer 505 by etching or deposition, for example.

Figure 5G:
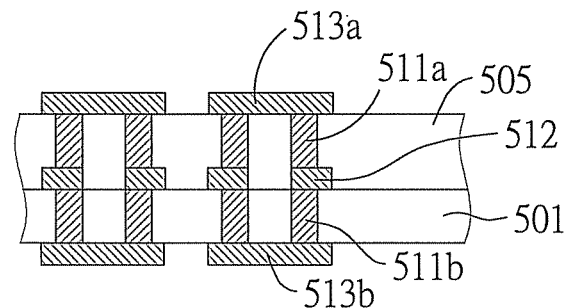

As shown in FIG. 5G, upper sections 513a composed of a conductive material are installed on the upper through-silicon vias 511a by a deposition technique, for example, wherein the upper section 513a has four arc-shaped conductive traces (313a, 323a, 333a and 343a, as shown in FIG. 3), each of which has one end electrically connected to the upper through-silicon via 511a.

Notice that in other embodiments of the invention, the connection section 512, the upper section 513a and the lower section 513b may all be installed as a redistribution layer (RDL).

Figure 1:
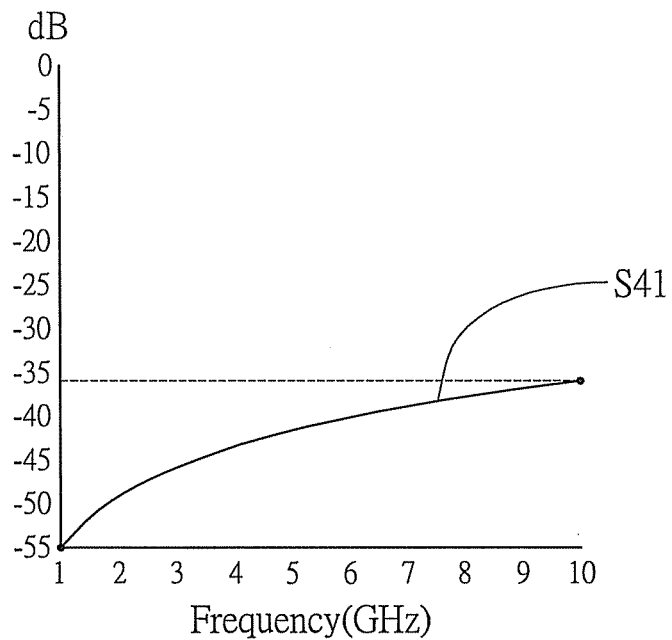
FIG. 1 shows a simulation of near-end crosstalk generated by a traditional TSV.
Figure 2:
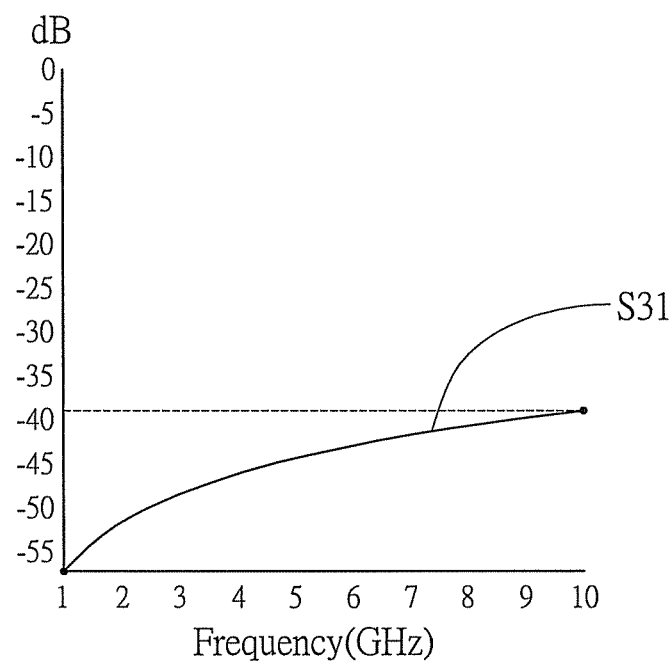
FIG. 2 shows a simulation of far-end crosstalk generated by a traditional TSV.
Figure 6:
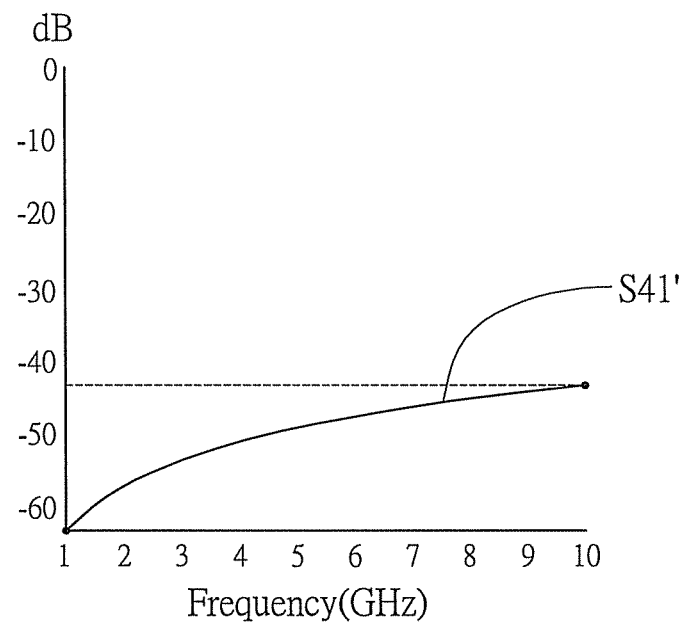
FIG. 6 shows a simulation of near-end crosstalk generated by an interconnecting mechanism according to an embodiment of the present invention.
Figure 7:
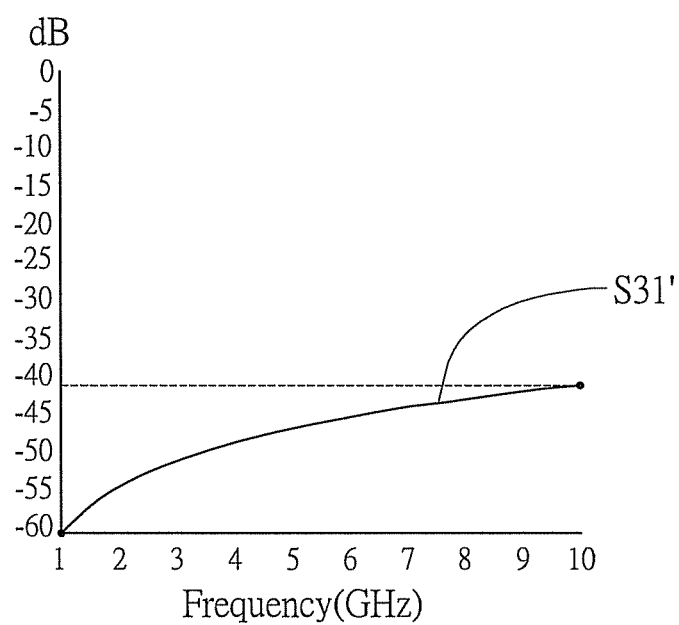
FIG. 7 shows a simulation of far-end crosstalk generated by an interconnecting mechanism according to an embodiment of the present invention.

Referring again to FIG. 3, the interconnecting mechanism 3 has two sets of differential transmitting structures, including a first port 3001, a second port 3002, a third port 3003 and a fourth port 3004. FIG. 6 shows a simulation result for near-end crosstalk generated by the interconnecting mechanism 3 of an embodiment according to the present invention (curve S41': crosstalk from the fourth port to the first port). The interconnecting mechanism 3 has a near-end crosstalk of −63.014 dB under a signal frequency of 1 GHz (curve S41'), and has a near-end crosstalk of −43.498 dB under a signal frequency of 10 GHz (curve S41'). FIG. 7 shows a simulation result for far-end crosstalk generated by the interconnecting mechanism 3 of an embodiment according to the present invention (curve S31': crosstalk from the third port to first port). The interconnecting mechanism 3 has a far-end crosstalk of −61.205 dB under a signal frequency of 1 GHz (curve S31'), and has a near-end crosstalk of −41.787 dB under a signal frequency of 10 GHz (curve S31'). It can be seen that an interconnecting mechanism disclosed in the present invention provides significant improvements in reducing near-end crosstalk and far-end crosstalk, as compared to the traditional through-silicon via structure (the efficacy of which is illustrated in FIGS. 1 and 2).

In conclusion, a through-silicon via structure in the present invention enables a 3D IC to effectively reduce crosstalk, and reduce far-end crosstalk and near-end crosstalk between input and output ports. As compared to the through-silicon via structure in the prior art, the through-silicon via structure disclosed in the present invention avoids further influence of crosstalk among electrical signals due to an increase of complexity of a system, while integrating different semiconductor processes to effectively lower the negative effects of near-end and far-end crosstalk in transmission between chips or substrates in a very economic way and simultaneously raising reliability of the semiconductor device using the technique and the manufacturing process.

The above-mentioned exemplary embodiments illustratively reveal the theory and efficacy of the disclosed invention, rather than limit the invention to the particular disclosed embodiments. Those familiar with this technical field will be able to make alterations to the embodiments without departing from the essential spirit and scope of the principles of the invention as defined in the following claims.

What is claimed is:

1. An interconnecting mechanism used in a three-dimensional integrated circuit, and formed in a dielectric layer, comprising:
   a paired first sub-interconnecting mechanism including a first spiral conductive element formed in the dielectric layer with a first axis perpendicular to a planar direction of the dielectric layer, and a second spiral conductive element formed in the dielectric layer with a second axis perpendicular to the planar direction of the dielectric layer, wherein the first spiral conductive element is axially symmetrical to the second spiral conductive element and has a first upper through-silicon via, a first lower through-silicon via, a first connection section, a first upper section and a first lower section, and wherein the first connection section is connected to the first upper through-silicon via and the first lower through-silicon via, and the first connection section is arc-shaped; and
   a paired second sub-interconnecting mechanism including a third spiral conductive element formed in the dielectric layer with a third axis perpendicular to the planar direction of the dielectric layer, and a fourth spiral conductive element formed in the dielectric layer with a fourth axis perpendicular to the planar direction of the dielectric layer, wherein the third spiral conductive element is axially symmetrical to the fourth spiral conductive element,
   wherein the third spiral conductive element and the fourth spiral conductive element are located beside the first spiral conductive element and the second spiral conductive element.

2. The interconnecting mechanism of claim 1, wherein the first connection section is dislocated from the first upper section and the first lower section.

3. The interconnecting mechanism of claim 1, wherein the first upper section and the first lower section are arc-shaped.

4. The interconnecting mechanism of claim 1, wherein the first upper through-silicon via and the first lower through-silicon via are perpendicular to the planar direction of the dielectric layer, and the first connection layer, the first upper section and the first lower section are parallel to the planar direction of the dielectric layer.

5. The interconnecting mechanism of claim 1, wherein the second spiral conductive element has a second upper through-silicon via, a second lower through-silicon via, a second connection section, a second upper section and a second lower section, wherein the second connection section is connected to the second upper through-silicon via and the second lower through-silicon via.

6. The interconnecting mechanism of claim 5, wherein the second connection section is dislocated from the second upper section and the second lower section.

7. The interconnecting mechanism of claim 5, wherein the second connection section, the second upper section and the second lower section are arc-shaped.

8. The interconnecting mechanism of claim 5, wherein the second upper through-silicon via and the second lower through-silicon via are perpendicular to the planar direction of the dielectric layer, and the second connection section, the second upper section and the second lower section are parallel to the planar direction of the dielectric layer.

9. The interconnecting mechanism of claim 1, wherein the third spiral conductive element has a third upper through-silicon via, a third lower through-silicon via, a third connection section, a third upper section and a third lower section, wherein the third connection section is connected to the third upper through-silicon via and the third lower through-silicon via.

10. The interconnecting mechanism of claim 9, wherein the third connection section is dislocated from the third upper section and the third lower section.

11. The interconnecting mechanism of claim 9, wherein the third connection section, the third upper section and the third lower section are arc-shaped.

12. The interconnecting mechanism of claim 9, wherein the third upper through-silicon via and the third lower through-silicon via are perpendicular to the planar direction of the dielectric layer, and the third connection section, the third upper section and the third lower section are parallel to the planar direction of the dielectric layer.

13. The interconnecting mechanism of claim 1, wherein the fourth spiral conductive element has a fourth upper through-silicon via, a fourth lower through-silicon via, a fourth connection section, a fourth upper section and a fourth lower section, wherein the fourth connection section is connected to the fourth upper through-silicon via and the fourth lower through-silicon via.

14. The interconnecting mechanism of claim 13, wherein the fourth connection section is dislocated from the fourth upper section and the fourth lower section.

15. The interconnecting mechanism of claim 13, wherein the fourth connection section, fourth upper section and fourth lower section are arc-shaped.

16. The interconnecting mechanism of claim 13, wherein the fourth upper through-silicon via and the fourth lower through-silicon via are perpendicular to the planar direction of the dielectric layer, and the fourth connection section, the fourth upper section and the fourth lower section are parallel to the planar direction of the dielectric layer.

* * * * *